(12) United States Patent
Ruegg et al.

(10) Patent No.: US 6,512,404 B2
(45) Date of Patent: Jan. 28, 2003

(54) LOW VOLTAGE CHARGE PUMP FOR USE IN A PHASE LOCKED LOOP

(75) Inventors: Michael A. Ruegg, Santa Cruz, CA (US); Sasan Cyrusian, Scotts Valley, CA (US)

(73) Assignee: Infineon Technologies AG, Munich (DE)

( * ) Notice: Subject to any disclaimer, the term of this patent is extended or adjusted under 35 U.S.C. 154(b) by 0 days.

(21) Appl. No.: 09/865,610

(22) Filed: May 25, 2001

(65) Prior Publication Data

US 2002/0175723 A1 Nov. 28, 2002

(51) Int. Cl.$^7$ .............................................. H03L 7/06
(52) U.S. Cl. ...................................... 327/157; 327/148
(58) Field of Search ................................. 327/148, 157, 327/112, 108, 111, 156; 375/374

(56) References Cited

U.S. PATENT DOCUMENTS

| | | | | |
|---|---|---|---|---|
| 5,963,025 A | * | 10/1999 | Colli ........................... | 323/288 |
| 6,107,889 A | * | 8/2000 | Strange et al. ............... | 327/156 |
| 6,160,432 A | * | 12/2000 | Rhee et al. .................. | 307/110 |
| 6,229,361 B1 | * | 5/2001 | Henwood .................... | 327/113 |
| 6,278,332 B1 | * | 8/2001 | Nelson et al. ............... | 327/108 |
| 6,326,852 B1 | * | 12/2001 | Wakayama .................. | 327/157 |
| 6,332,004 B1 | * | 12/2001 | Chan ........................... | 375/257 |

OTHER PUBLICATIONS

"Synchronous Recording Channels—PRML & Beyond", rev. 5.61 14.E.18, 1999, published by Knowledge Tek, Inc., Broomfield, Colorado.

"PRML: Seagate Uses Space Age Technology" available on the Internet at http://www.seagate.com/support/kb/disc/prml.html, 2 pages, last accessed Apr. 9, 2001.

"Technologies—PRML" available on the internet at http://www.idema.org/about/industry/ind_tech_prml.html, 1 page, last accessed Apr. 9, 2001.

"Reference Guide —Hard Disk Drives" available on the Internet at http://www.storagereview.com/guide2000/ref/hdd, 13 pages, last accessed Apr. 9, 2001.

"MR and PRML: Technologies in Synergy" available at on the Internet at http://www.lionsgate.com/Home/Baden/public_html_index/SCSI/Quantum_White_Papers/MR_Head/MR, 4 pages, last accessed Apr. 9, 2001.

"A Tutorial on Convolutional Coding with Viterbi Decoding" available on the Internet at http://pw1.netcom.con/<chip.f/viterbi/tutorial.html, 10 pages, last accessed Apr. 9, 2001.

* cited by examiner

Primary Examiner—Timothy P. Callahan
Assistant Examiner—Linh Nguyen
(74) Attorney, Agent, or Firm—Brinks Hofer Gilson & Lione

(57) ABSTRACT

A low voltage charge pump for a phase locked loop is disclosed. The low voltage charge pump provides linear control for a voltage at a loop filter. The charge pump is supplied by a power supply between 1.6 and 2.0 V and is configured to provide linear charging and discharging of the loop filter to a potential between 150 mVolts to within 150 mVolts of the power supply voltage.

28 Claims, 4 Drawing Sheets

PRIOR ART

PRIOR ART

LOW VOLTAGE CHARGE PUMP FOR USE IN A PHASE LOCKED LOOP

BACKGROUND

Computer hard disk drives, also known as fixed disk drives or hard drives, have become a de facto data storage standard for computer systems and are making inroads into consumer electronics as well. Their proliferation can be directly attributed to their low cost, high storage capacity and reliability, in addition to wide availability, low power consumption, fast data transfer speeds and decreasing physical size.

Disk drives typically consist of one or more rotating magnetic platters encased within an environmentally controlled housing. The disk drive further includes electronics and mechanics for reading and writing data and interfacing with other devices. Read/write heads are positioned in proximity of the platters, typically towards each face, to record and read data. The hard drive electronics are coupled with the read/write heads and include numerous components to control the position of the heads and generate or sense the electromagnetic fields representing data. The electronics encode data received from a host device, such as a personal computer, and translate the data into magnetic encodings, which are written onto the disk platters. When the host device requests data, the electronics locate the desired data on the platters, sense the magnetic encodings that represent that data, and translate the encodings into the binary digital information. Error detection and correction algorithms may also be applied to ensure accurate storage and retrieval of data.

Advancements in the read/write head and the methods of interpreting magnetic encodings have been made. A traditional hard drive has several read/write heads that interface with the several magnetic platters and the hard drive electronics. The read/write heads detect and record the encoded data as areas of magnetic flux. Data bits, consisting of binary 1's and 0's, are encoded by the presence or absence of flux reversals. A flux reversal is a change in the magnetic flux in two contiguous areas of the disk platter. Data is read using method as "Peak Detection" by which a voltage peak imparted in the read/write head is detected when a flux reversal passes the read/write head. However, increasing storage densities, which require reduced peak amplitudes, better signal discrimination and higher platter rotational speeds, are pushing the peaks in closer proximity. Thus, peak detection methods are becoming increasingly complex.

Magneto-resistive ("MR") read/write heads have been developed. MR read/write heads have increased sensitivity to sense smaller amplitude magnetic signals and provide increased signal discrimination, addressing some of the problems with increasing storage densities. In addition, technology known as Partial Response Maximum Likelihood ("PRML") has been developed to further address the desire to provide increased data storage densities. PRML is an algorithm implemented in the disk drive electronics to interpret the magnetic signals sensed by the read/write heads. PRML based disk drives read the analog waveforms generated by the magnetic flux reversals stored on the disk. Instead of looking for peak values, PRML based drives digitally sample this analog waveform (the "Partial Response") and use advanced signal processing technologies to determine the bit pattern represented by that waveform (the "Maximum Likelihood"). This technology, combined with MR heads, have permitted further increases in data storage densities. PRML technology tolerates more noise in the magnetic signals, permitting use of lower quality platters and read/write heads, which also increases manufacturing yields and lowers costs.

With many different drives available from multiple manufacturers, hard drives are typically differentiated by factors such as cost/megabyte of storage, data transfer rate, power requirements and form factor (physical dimensions) with the bulk of competition based on cost. With most competition between hard drive manufacturers coming in the area of cost, there is a need for enhanced hard drive components which prove cost effective in increasing supplies and driving down manufacturing costs all while increasing storage capacity, operating speed, reliability and power efficiency.

SUMMARY

The embodiments described below to a low voltage charge pump for a phase locked loop ("PLL") in a partial response, maximum likelihood ("PRML") based read/write channel for a hard disk drive. The charge pump is operative to provide linear control of a potential at a loop filter node of the PLL. The charge pump includes a linear pull-up circuit operative to selectively increase the potential at the loop filter node. The charge pump further includes a linear pull-down circuit operative to selectively decrease the potential at the loop filter node. The pull-up circuit is operative to linearly increase the potential to a voltage within 150 mV of a most positive supply voltage of the pull-up circuit, and the pull-down circuit is operative to linearly decrease the potential to voltage within 150 mV of a least positive supply voltage of the pull-up circuit. The pull-up circuit and the pull-down circuit are configured to provide a substantially constant current at the loop filter input node independent of the loop filter node voltage.

The preferred embodiments further relate to a method for charging a loop filter. The method includes the acts of selectively increasing a potential for a loop filter node by providing positive constant current to the loop filter node; and selectively decreasing a potential for the loop filter node by drawing a negative constant current from the loop filter input node. The act of increasing the potential includes using a positive constant current source configured to provide current to the loop filter input node, wherein the loop filter node potential is linearly increased to within 150 mV of a most positive power supply voltage for the constant current source. The act of decreasing the potential includes using a negative constant current source configured to draw substantially constant current from the loop filter input node, wherein the loop filter node potential is linearly decreased to within 150 mV of a least positive power supply voltage for the constant current source.

The foregoing discussion of the summary of the invention is provided only by way of introduction. Nothing in this section should be taken as a limitation on the claims, which define the scope of the invention. Additional objects and advantages of the present invention will be set forth in the description that follows, and in part will be obvious from the description, or may be learned by practice of the present invention. The objects and advantages of the present invention may be realized and obtained by means of the instrumentalities and combinations particularly pointed out in the claims.

DETAILED DESCRIPTION

The embodiment described herein relates to a PRML based read/write channel device. The read/write channel is coupled with the read/write heads of the hard drive. Herein, the phrase "coupled with" is defined to mean directly connected to or indirectly connected through one or more intermediate components. Such intermediate components may include both hardware and software based components. The read/write channel converts digital data from the host device into electrical impulses to control the read/write head to magnetically record data to the hard disk. During read operations, the read/write channel receives an analog waveform magnetically sensed by the read/write heads and converts that waveform into the digital data stored on the drive.

The illustrated embodiments provide a low voltage charge pump for a synthesizer and a PLL system used in a PRML read/write channel. Hereinafter, embodiments of the present invention will be explained with reference to accompanied FIGS. 1 through 5.

Figures 1A, 1B:
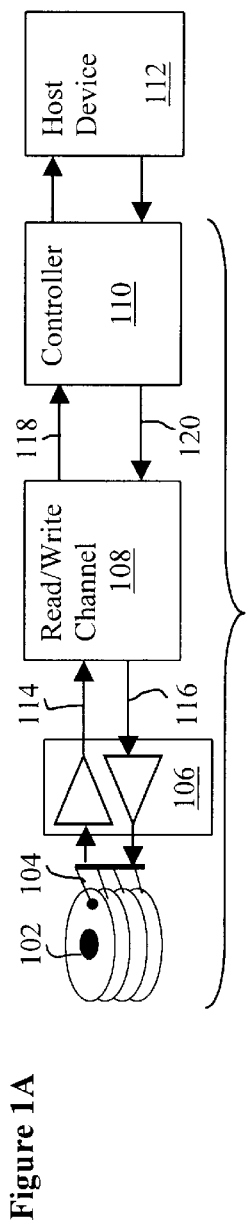
FIG. 1A depicts block diagram of an exemplary hard drive coupled with a host device.
FIG. 1B depicts a block diagram of read/write channel for use with a hard drive.

Referring to FIG. 1A, a block diagram for a hard drive 100 coupled with a host device 112 is shown. For clarity, some components, such as a servo/actuator motor control, are not shown. The drive 100 includes the magnetic surfaces and spindle motor 102, the read/write heads and actuator assembly 104, pre-amplifiers 106, a read/write channel 108 and a controller 110. The pre-amplifiers 106 are coupled with the read/write channel 108 via interfaces 114 and 116. The controller 110 interfaces with the read/write channel 108 via interfaces 118 and 120.

For reads from the hard disk 100, the host device 112 provides a location identifier that identifies the location of the data on the disk drive, e.g. a cylinder and sector address. The controller 110 receives this address and determines the physical location of the data on the platters 102. The controller 110 then moves the read/write heads into the proper position for the data to spin underneath the read/write heads 104. As the data spins underneath the read/write head 104, the read/write head 104 senses the presence or absence of flux reversals, generating a stream of analog signal data. This data is passed to the pre-amplifiers 106 which amplifies the signal and passes it to the read/write channel 108 via the interface 114. As will be discussed below, the read/write channel receives the amplified analog waveform from the pre-amplifiers 106 and decodes this waveform into the digital binary data that it represents. This digital binary data is then passed to the controller 110 via the interface 118. The controller 110 interfaces the hard drive 100 with the host device 112 and may contain additional functionality, such as caching or error detection/correction functionality, intended to increase the operating speed and/or reliability of the hard drive 100.

For write operations, the host device 112 provides the controller 110 with the binary digital data to be written and the location, e.g. cylinder and sector address, of where to write the data. The controller 110 moves the read/write heads 104 to a designated location and sends the binary digital data to be written to the read/write channel 108 via interface 120. The read/write channel 108 receives the binary digital data, encodes it and generates analog signals which are used to drive the read/write head 104 to impart the proper magnetic flux reversals onto the magnetic platters 102 representing the binary digital data. The generated signals are passed to the pre-amplifiers 106 via interface 116 which drive the read/write heads 104.

Referring to FIG. 1B, an exemplary read/write channel 108 is shown that supports Partial Response Maximum Likelihood ("PRML") encoding technology for use with the hard drive 100 of FIG. 1A. For clarity, some components have been omitted. The read/write channel 108 may be implemented as an integrated circuit using a complementary metal oxide semiconductor ("CMOS") process for transistors having an effective channel length of 0.18 micron. It will be appreciated that other process technologies and feature sizes may used and that the circuitry disclosed herein may be further integrated with other circuitry comprising the hard disk electronics such as the hard disk controller logic. As was described, the read/write channel 108 converts between binary digital information and the analog signals representing the magnetic flux on the platters 102. The read/write channel 108 is divided into two main sections, the read path 156 and the write path 158.

The write path 158 includes a parallel-to-serial converter 144, a run-length-limited ("RLL") encoder 146, a parity encoder 148, a write pre-compensation circuit 150 and a driver circuit 152. The parallel to serial converter 144 receives data from the host device 112 via the interface 120 eight bits at a time. The converter 144 serializes the input data and sends a serial bit stream to the RLL encoder 146. The RLL encoder 146 encodes the serial bit stream into symbolic binary sequences according to a run-length limited algorithm for recording on the platters 102. The exemplary RLL encoder may use a 32/33-bit symbol code to ensure that flux reversals are properly spaced and that long runs of data without flux reversals are not recorded. The RLL encoded data is then passed to the parity encoder 148 that adds a parity bit to the data. In the exemplary parity encoder 148, odd parity is used to ensure that long run's of 0's and 1's are not recorded due to the magnetic properties of such recorded data. The parity-encoded data may be subsequently treated as an analog signal rather than a digital signal. The analog signal is passed to a write pre-compensation circuit 150 that dynamically adjusts the pulse widths of the bit stream to account for magnetic distortions in the recording process. The adjusted analog signal is passed to a driver circuit 152 that drives the signal to the pre-amplifiers 106 via interface 116 to drive the read/write heads 104 and record the data. The exemplary driver circuit 152 includes a pseudo emitter coupled logic ("PECL") driver circuit that generates a differential output to the pre-amplifiers 106.

The read path 156 includes an attenuation circuit/input resistance 122, a variable gain amplifier ("VGA") 124, a magneto-resistive asymmetry linearizer ("MRA") 126, a continuous time filter ("CTF") 128, a buffer 130, an analog to digital converter ("ADC") 132, a finite impulse response ("FIR") filter 134, an interpolated timing recovery ("ITR") circuit 136, a Viterbi algorithm detector 138, a parity decoder 140, and a run-length-limited ("RLL") decoder 142. The amplified magnetic signals sensed from the platters 102 by the read/write head 104 are received by the read/write channel 108 via interface 114. The analog signal waveform representing the sensed magnetic signals is first passed through an input resistance 122 that is a switching circuit to attenuate the signal and account for any input resistance. The attenuated signal is then passed to a VGA 124 that amplifies the signal. The amplified signal is then passed to the MRA 126 that adjusts the signal for any distortion created by the recording process. Essentially, the MRA 126 performs the opposite function of the write-pre-compensation circuit 150 in the write path 158. The signal is next passed through the CTF 128, which is essentially a low pass filter, to filter out noise. The filtered signal is then passed to the ADC 132 via the buffer 130 that samples the analog signal and converts it to a digital signal. The digital signal is then passed to a FIR filter 134 and then to a timing recovery circuit 136. The timing recovery circuit 136 may be connected (not shown in the figure) to the FIR filter 134, the MRA 126 and the VGA 124 in a feedback orientation to adjust these circuits according to the signals received to provide timing compensation. The exemplary FIR filter 134 may be a 10 tap FIR filter. The digital signal is then passed to the Viterbi algorithm detector 138 that determines the binary bit pattern represented by the digital signal using digital signal processing techniques. The exemplary Viterbi algorithm detector 138 uses a 32 state Viterbi processor. The binary data represented by the digital signal is then passed to the parity decoder 140, which removes the parity bit, and then to the RLL decoder 142. The RLL decoder 142 decodes the binary RLL encoding symbols to the actual binary data. This data is then passed to the controller 110 via the interface 118.

The read/write channel 108 further includes a clock synthesizer 154. The exemplary clock synthesizer 154 includes a phase locked loop ("PLL"), having a charge pump and loop filter, and a voltage controlled oscillator ("VCO"), also referred to as a variable frequency oscillator ("VFO"). The VCO provides a clock signal to synchronize data read operations. The PLL controls the frequency of the clock signal provided by the VCO. In particular, the charge pump controls a potential to the loop filter node to adjust the frequency of the VCO.

Figure 2:
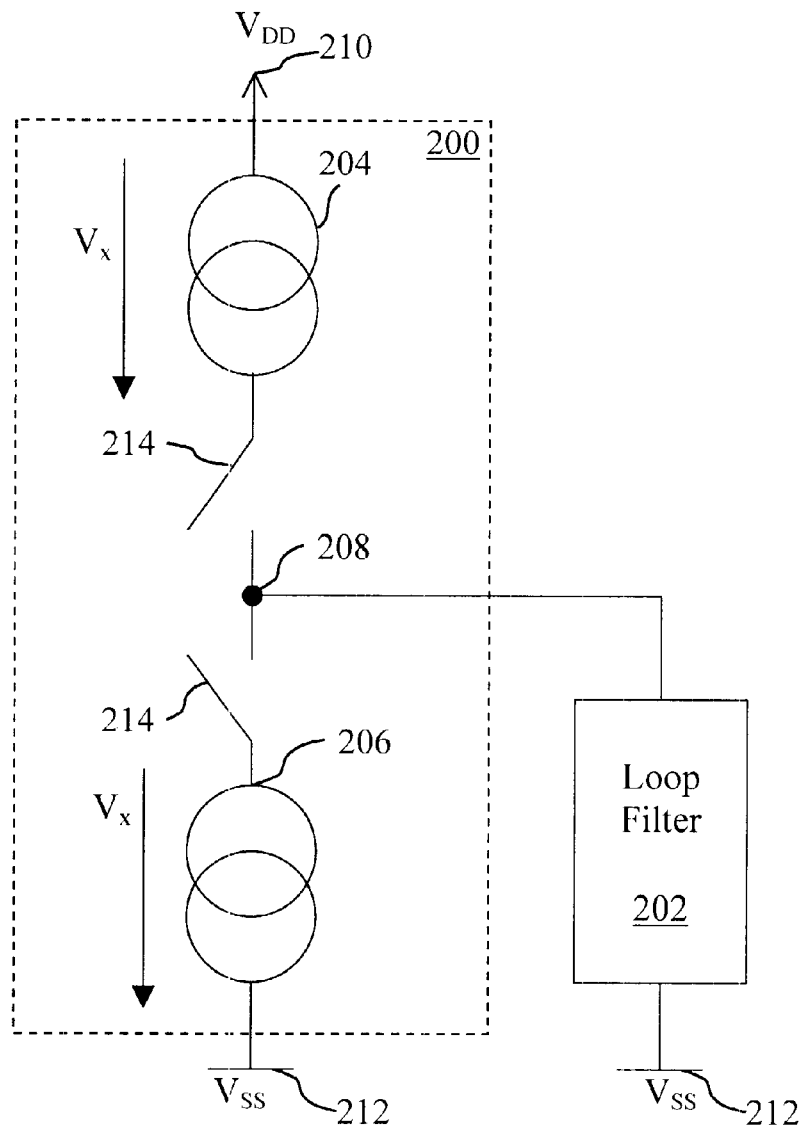
FIG. 2 is a schematic diagram of a prior art charge pump.

Referring to FIG. 2, an exemplary charge pump 200 for a loop filter 202 is shown. The charge pump 200 includes an up-current source 204 and a down-current source 206. The up-current source 204 and the down-current source 206 are each characterized by a voltage drop Vx. The up-current source 204 is coupled with a most positive power supply voltage 210 ($V_{DD}$). The down current source 206 is coupled with a least positive power supply voltage ($V_{SS}$) 212. The charge pump 200 may be coupled with a loop filter 202 through switch devices 214. The switch devices 214 are configured to selectively couple the current sources 204 and 206 to the loop filter 202. The switch devices 214 may be controlled by a signal provided external from the charge pump 200.

The loop filter 202 may be configured to provide a voltage potential at a loop filter node 208. Over a voltage range, a current/voltage relationship for the loop filter 202 has similar properties to a capacitive element. Specifically, the potential at the loop filter node 208 can be characterized by the following linear expression:

$$z * \Delta v / \Delta t = I \qquad \text{eq. 1}$$

where "z" is capacitive impedance of the loop filter; "$\Delta v/\Delta t$" is the change in potential at the loop filter node 208 with respect to time; and "I" is current into the loop filter. Because "z" remains constant, the potential at the loop filter node 208 can be increased with current provided to the loop filter node 208 and decreased with current drawn from the loop filter node 208. Accordingly, the up-current source 204 charges the loop filter node 208 by providing a constant positive current to the loop filter 202 and the down-current source 206 discharges the loop filter node 208 by drawing a constant current from the loop filter 202. Due to the voltage drop Vx, the potential at the loop filter node 208 is operative within a range having a minimum potential of Vx to a maximum potential of ($V_{DD}$–VX)

Figure 3:
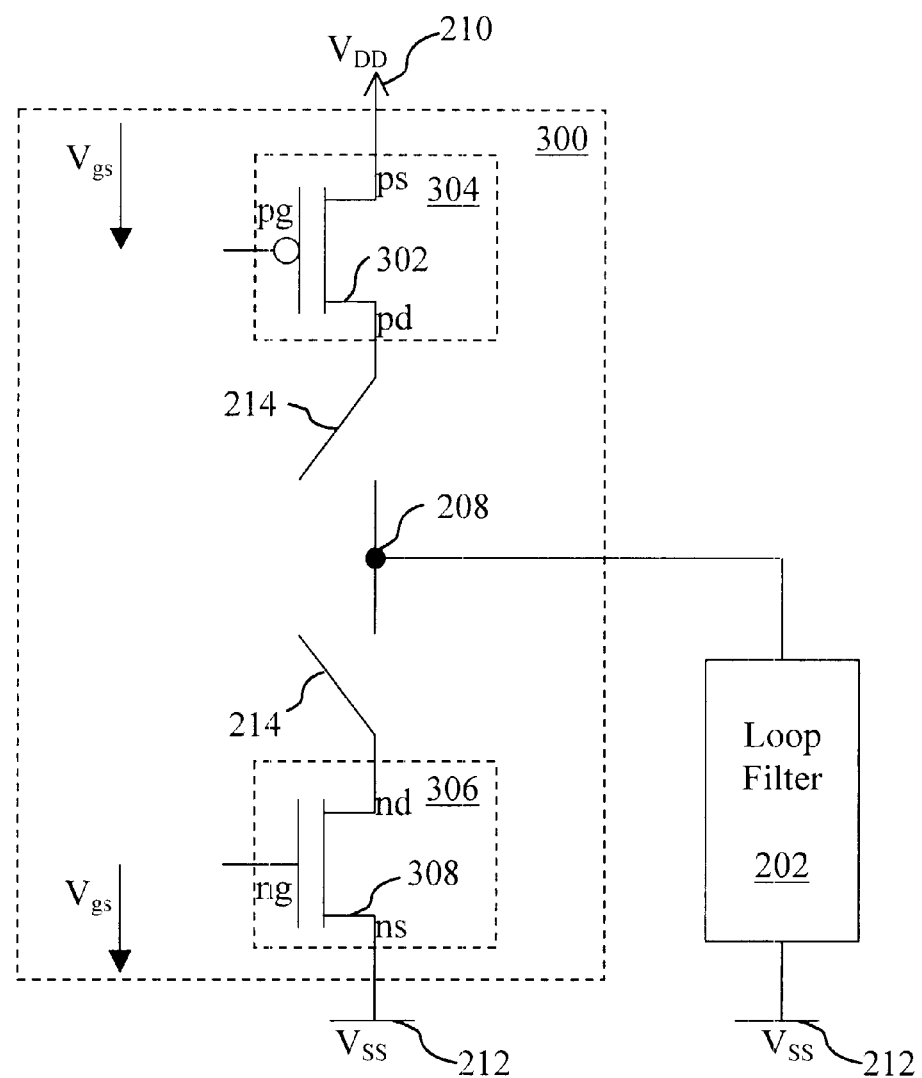
FIG. 3 is a schematic diagram of another prior art charge pump.

Referring to FIG. 3, an example of a conventional CMOS based charge pump 300 is shown. The CMOS based charge pump includes an up-current source 304 and a down-current source 306. The charge pump 300 may further include switch devices 214. The switch devices 214 may be configured to selectively couple the current transistors 304 and 306 to the loop filter node 208. The switch devices may be controlled by a signal provided external to the charge pump 300.

The up-current source 302 may include one or more PMOS transistors 302. The PMOS transistor 302 has a source node (ps), a gate node (pg), and a drain node (pd). The source node (ps) may be coupled with $V_{DD}$ 210. The drain node (pd) may be selectively coupled with the loop filter node 208 through the switch device 214. A potential, provided at the gate node (pg), controls current a PMOS drain-to-source current. Additional cascode transistors may be used in the up-current source 304 to increase output impedance.

The down-current source 306 may include one or more NMOS transistors 308. The NMOS transistor 308 has a source node (ns), a gate node (ng), and a drain node (nd). The source node (ns) may be coupled with $V_{SS}$ 212. The drain node (nd) is selectively coupled with the loop filter node 208 through the switch device 214. A potential, provided at the gate node (ng), controls current an NMOS drain-to-source current. Additional cascode transistors may be used in the down-current source 306 to increase output impedance.

The current provided by the PMOS transistor 302 remains substantially constant over a limited range of potential at the loop filter node 208. Specifically, the PMOS transistor 302 provides constant current when a drain-to-source voltage $V_{DS}$ is greater than a minimum voltage. As the potential at the loop filter node 208 increases, $V_{DS}$ for the PMOS transistor 302 decreases. Similarly, as the potential at the loop filter node 208 decreases, $V_{DS}$ for the NMOS transistor 308 decreases. When $V_{DS}$ decreases beyond a minimum voltage, the PMOS transistor 302 and the NMOS transistor 308 turn-off. The maximum potential to which the loop filter node 208 can be charged is limited to the $V_{DD}$ voltage less the minimum $V_{DS}$ for the PMOS transistor. Similarly, the minimum potential to which the loop filter node 208 can be discharged is limited to the $V_{DD}$ voltage plus the minimum $V_{DS}$ for the NMOS transistor 308.

To maximize the voltage range for the loop filter node 208, the power supply voltages 210 and 212 are maximized. However, a circuit design having lower power supply voltages is preferred. Accordingly, a low voltage charge pump configured to provide constant current is desired.

Figure 4:
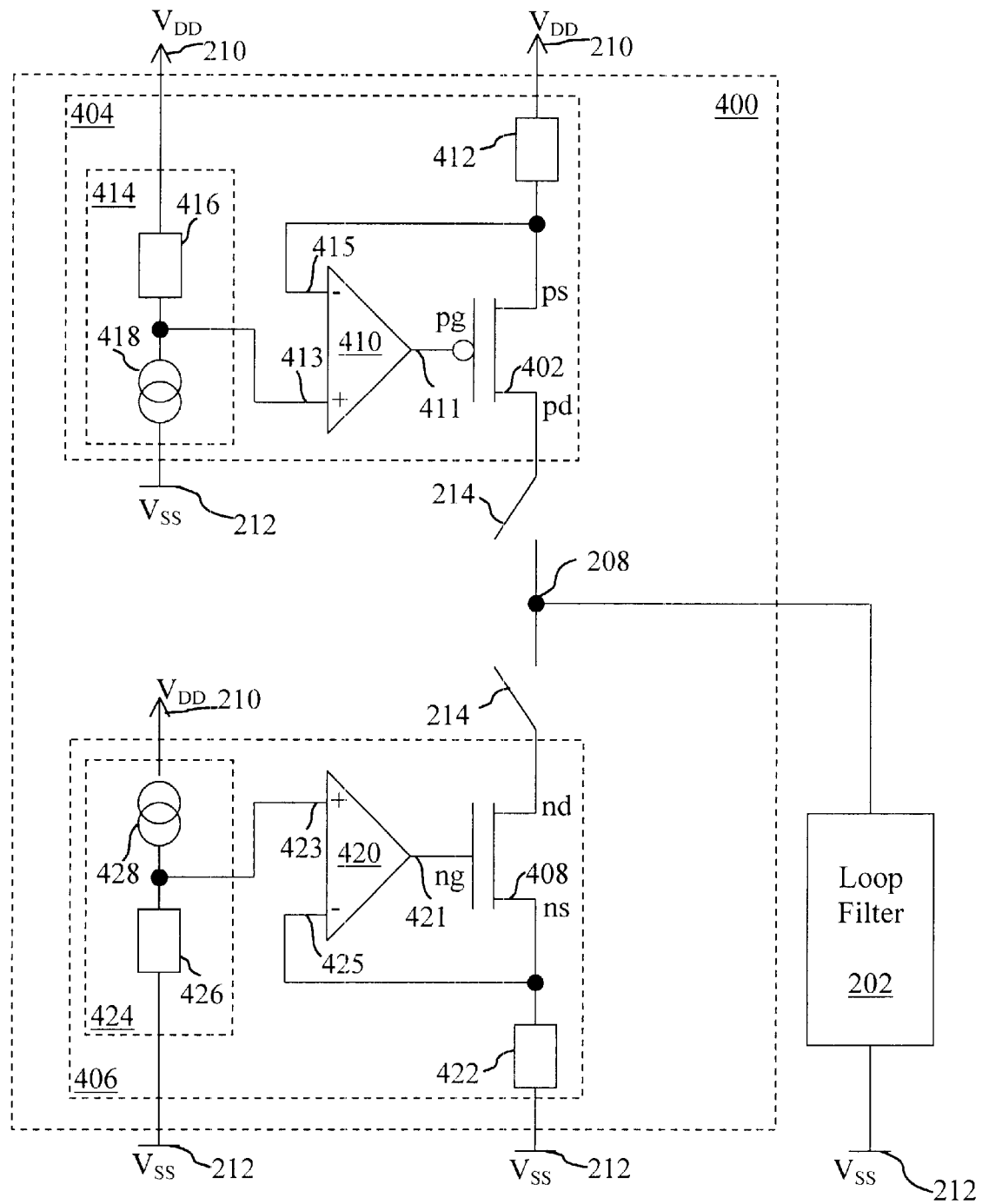
FIG. 4 is a schematic diagram of an embodiment of a low voltage charge pump.

Referring to FIG. 4, a low voltage charge pump 400 for use in a PLL loop filter is shown. The low voltage charge pump has a low supply voltage $V_{DD}$ relative to prior art charge pumps and is configured to provide linear charging of a loop filter node 208 over a wide voltage range for the loop filter node 208.

The low voltage charge pump 400 includes a positive current source 404, a negative current source 406, and a loop filter input node 208. The charge pump 400 may further include switch devices 214. The positive current source 404 and the negative current source 406 are coupled with the loop filter input node 208. The positive current source 404 may be arranged to selectively charge the loop filter input node 208 by providing a constant current to the loop filter 202 at a low supply voltage. The negative current source 406 may be arranged to selectively discharge the loop filter input node 208 by drawing a constant current from the loop filter 202 at a low supply voltage. The switch devices 214 may be controlled by signals provided external from the charge pump 400.

The negative current source 406 includes a first reference voltage source 424, an NMOS transistor 408, a pull-down resistor device 422; and a first buffer 420. The NMOS transistor 408 includes a source node (ns), a gate node (ng), and a drain node (nd). The NMOS transistor 420 may be configured as a source follower wherein the drain node (nd) may be coupled with the loop filter input node 208 through the switch device 214. The source node (ns) may be coupled with the pull-down resistor device 422. A second end of the pull-down resistor device 422 is coupled with $V_{SS}$ 212.

The first buffer 420 has a positive input node 423, a negative input node 425 and an output node 421. The negative input node 425 may be coupled with the source node (ns). The positive input node 423 may be coupled with the first reference voltage source 424. The first reference voltage source 424 provides a first reference voltage to the first buffer positive input 423. The output node 421 may be coupled with the gate node (ng).

The first reference voltage source 424 may include a first reference current source 428 coupled with a first reference resistor device 426. A current provided by the first reference current source 428 flows through the first reference resistor device 426 to generate the first reference voltage at the first buffer positive input node 423. The first reference current source 428 and the first reference resistor device are configured to provide a first reference voltage substantially between 0.050 Volts and 0.200 Volts. The first buffer 420 propagates the first reference voltage to the source node (ns) via a feedback provided by coupling the source node (ns) to the negative input node 425. Accordingly, a potential across the pulldown resistor device 422 remains substantially constant. When the potential across the pull-down resistor device 422 is substantially constant, a substantially constant current is drawn from the loop filter 202 at the loop filter node 208. The negative current source 406 draws constant current from the loop filter 202 independent of the potential at the loop filter input node 208 and the power supply voltages $V_{SS}$ and $V_{DD}$.

The positive current source 404 includes second reference voltage source 414, a PMOS transistor 402, a pull-up resistor device 412, and a second buffer 410. The PMOS transistor 402 includes a source node (ps), a gate node (pg), and a drain node (pd). The PMOS transistor 402 may be configured as a source follower wherein the drain node (pd) may be coupled with the loop filter input node 208 through the switch device 214 and the source node (ps) may be coupled with $V_{DD}$ the pull-up resistor device 412. A second end of the pull-up resistor device 412 may be coupled to VDD 210.

The second buffer 410 has a positive input node 413, a negative input node 415, and an output node 411. The negative input node 415 may be coupled with the source node (ps) and the positive input node 413 may be coupled with the second reference voltage source 414. The second reference voltage source 414 provides a second reference voltage to the positive input node 413. The output node 411 may be coupled with the gate node (pg).

The second reference voltage source 414 may include a second reference current source 418 coupled with a second reference resistor device 416. A current provided by the second reference current source 418 flows through the second reference resistor device 416 to generate the second reference voltage at the positive input node 413. The second reference current source 418 and the second reference resistor device 416 are arranged to provide the second reference voltage substantially between 0.050 Volts and 0.200 Volts. The second buffer 410 propagates the second reference voltage at the source node (ps) via a feedback provided by coupling the source node (ps) to the negative input node 415. Accordingly, a potential across the pull-up resistor device 412 remains substantially constant. When the potential across the pull-up resistor device 412 is substantially constant, a substantially constant current is drawn from the loop from the loop filter 202 at the loop filter node 208. The positive current source 404 provides constant current from the loop filter independent of the potential at the loop filter input node 208 and the power supply voltages $V_{SS}$ and $V_{DD}$.

The first buffer 420 and the second buffer 410 are operational amplifiers ("OP-AMP") with a gain substantially between 60 dB and 80 dB. The pull-down resistor device 422, the first reference resistor device 426, the pull-up resistor device 412, and the second reference resistor device 416 are each approximately 156 Ohms. It is preferred that the positive current source 404 is configured to linearly charge the potential of the loop filter node 208 to a maximum potential equal to $V_{DD}$–150 mVolts and the negative current source 404 is configured to linearly discharge the potential of the loop filter node 208 to a minimum potential equal to $V_{SS}$+150 mVolts.

The voltage, $V_{DD}$, on the most positive supply voltage node 210 is less than 2.0 Volts and the voltage, $V_{SS}$, on the least-positive supply voltage node 212 is approximately ground (0.0 Volts). It is preferred that $V_{DD}$ is between 1.60 Volts and 1.80 Volts. By way of example, when $V_{DD}$ is 1.8 Volts, the positive current source 404 is configured to linearly charge the potential at the loop filter node 208 to a maximum voltage of 1.65 Volts. Similarly, when and $V_{SS}$ is ground (0.0 Volts), the negative current source 406 is configured to linearly discharge the potential at the loop filter node 208 to a minimum voltage of 0.15 Volts.

The potential at the loop filter node 208 is controlled by selectively charging a loop filter input node 208 with a low voltage positive current source 404, and selectively discharging a loop filter input node 208 with a low voltage negative current source 406. The loop filter input node 208 is charged to within 150 mVolts of a power supply voltage. It is preferred that the positive current is provided to the loop filter input node 208 at a voltage of 2.0 Volts and the loop filter input node is charged to 1.85 Volts. It is further preferred that the positive current is provided to the loop filter input node at a voltage of 1.6 Volts, the loop filter input node 208 is charged to a maximum 1.45 Volts and discharged to a minimum 0.15 Volts.

Suitable transistor sizes specifying channel width-to-length ratios (measured in micrometers or microns) for the transistors that make up the depicted circuits have been omitted from the figures. It will be appreciated that suitable ratios may be chosen depending on the design requirements and the capabilities and limitations of the particular integrated circuit fabrication process used for implementation of the circuit as well as the performance requirements of the specific embodiment.

A low voltage charge pump for a synthesizer or PLL capable of charging a loop filter node with constant current can be obtained. The low voltage charge pump may be used in a variety of applications including a phase locked loop in a PRML hard disk drive. The present embodiment is applicable to charging a loop filter node in a PRML read/write channel for hard disk drive. In particular, the present invention relates to the synthesizer/PLL circuit for the hard disk drive. All of the components of the low voltage charge pump for a synthesizer/PLL may be integrated with the read/write channel on a single integrated circuit semiconductor chip. Alternatively, some or all of the components of the charge pump may be implemented in one or more integrated circuits external to a read/write channel.

The low voltage charge is not limited to the circuits as shown in FIGS. 1–4 and described above. Various implementations of methods described herein can be realized that are within the scope of the low voltage charge pump. All of the components for the low voltage charge pump may be integrated into a PRML read/write channel circuit on a single integrated circuit semiconductor chip. Alternatively, some or all of the components of the circuit according to the principles of the present invention may be implemented in one or more integrated circuits external to a PRML read/write channel circuit.

While particular embodiments of the present invention have been shown and described, modifications may be made. It is therefore intended in the appended claims, including all equivalents, cover all such changes and modifications.

What is claimed is:

1. A low voltage charge pump, comprising:
    a negative current source having a most positive supply voltage that is less than 2.0 Volts and being operative over an operating range for the loop filter to selectively discharge a loop filter with substantially constant negative current that is substantially linearly dependent on a first reference voltage; and
    a positive current source having a most positive supply voltage that is less than 2.0 Volts and being operative over the operating range for the loop filter to selectively charge the loop filter with substantially constant positive current that is substantially linearly dependent on a second reference voltage.

2. The low voltage charge pump of claim 1, wherein the negative current source comprises:
    a first reference voltage source;
    a first buffer having a first buffer positive input being coupled with the first reference voltage source; and
    an NMOS transistor having an NMOS source, an NMOS gate, and an NMOS drain, the NMOS drain being coupled with the loop filter, the NMOS gate being coupled with an output for the first buffer and the NMOS source being coupled with a first negative input of the first buffer and coupled with a least positive supply voltage through a pull-down resistor device.

3. The low voltage charge pump of claim 2, wherein the first reference voltage source comprises a first reference current source, and a first reference resistor device coupled with the first reference current source, the first reference constant current source and the first reference resistor device arranged to generate a first reference voltage at a first reference voltage node.

4. The low voltage charge pump of claim 3, wherein the first reference current source is coupled in series between the least positive supply voltage and the first reference voltage node, and the first reference resistor device is coupled in series with the first reference voltage node and the most positive supply voltage.

5. The low voltage charge pump of claim 4, wherein the most positive supply voltage is less than 2.0 Volts, the least positive supply voltage is substantially zero Volts, and the first buffer is an operational amplifier having a gain of substantially between 60 dB and 80 dB.

6. The low voltage charge pump of claim 5, wherein the first reference voltage is between 0.050 Volts and 0.20 Volts.

7. The low voltage charge pump of claim 6, wherein the most positive supply voltage is approximately 1.80 Volts.

8. The low voltage charge pump of claim 2, wherein the positive current source comprises:
    a second reference voltage source;
    a second buffer having a second buffer positive input being coupled with the second reference voltage source; and
    a PMOS transistor having a PMOS source, a PMOS gate, and a PMOS drain, the PMOS drain being coupled with the loop filter, the PMOS gate being coupled with a second buffer output and the PMOS source being coupled with a second buffer negative input and coupled with the most positive supply voltage through a pull-up device.

9. The low voltage charge pump of claim 8, wherein the second reference voltage source comprises a second reference current source and a second reference resistive device coupled with the second reference current source, the second reference current source and the second reference resistive device arranged to provide a second reference voltage at a second reference voltage node.

10. The charge pump of claim 9, wherein the second reference current source is coupled in series between the most positive supply voltage and the second reference voltage node, and the second reference resistor device is coupled in series between the second reference voltage node and the least positive supply voltage.

11. The charge pump of claim 10, wherein the most positive supply voltage is less than 2.0 Volts, the least positive supply voltage is substantially zero Volts, and the second buffer is an operational amplifier having a gain substantially between 60 dB and 80 dB.

12. The charge pump of claim 11, wherein the first reference voltage and the second reference voltage are between 0.050 Volts and 0.20 Volts.

13. The charge pump of claim 12, wherein the most positive supply voltage is substantially 1.80 Volts.

14. An integrated circuit comprising:
    a negative current source coupled between a loop filter and ground and having a most positive supply voltage that is less than 2.0 Volts and being, the negative current source being operative over the operating range for the loop filter to draw constant current from the loop filter to linearly discharge the loop filter to a potential substantially 0.15 Volts; and
    a positive current source coupled between the loop filter input node and a supply voltage that is less than 2.0 Volts, the positive current source configured to supply constant current to the loop filter over the operating range for the loop filter to linearly charge the loop filter to a potential of substantially 0.15 Volts less than the supply voltage.

15. The integrated circuit of claim 14, wherein the negative current source comprises:
    a first reference voltage source;
    an NMOS transistor configured as a source follower and having an NMOS source, an NMOS gate, and an NMOS drain, the NMOS drain being electrically coupled with the loop filter;
    a first resistor device configured as a pull-down current source and being coupled in series between the NMOS source and the least positive supply voltage; and a first buffer having a first buffer positive input, a first buffer negative input and a first buffer output, the first buffer negative input being coupled with the NMOS source, the first buffer positive input being coupled with the first reference voltage source, and the first buffer output being coupled with the NMOS gate.

16. The integrated circuit of claim 15, wherein the positive current source comprises:

second reference voltage source;

a PMOS transistor configured as a source follower and having a PMOS source, a PMOS gate, and a PMOS drain, the PMOS drain being electrically coupled with the loop filter;

a second resistor device configured as a pull-up current source and being coupled in series between the PMOS source and the most positive supply voltage; and a second buffer having a second buffer positive input, a second buffer negative input and a second buffer output, the second buffer negative input being coupled with the PMOS source, the second buffer positive input being coupled with the second reference voltage source, and the second buffer output being coupled with the PMOS gate.

17. A method of controlling a potential for a loop filter, the method comprising:

generating a first reference voltage and a second reference voltage;

selectively discharging the loop filter with a low voltage negative current source, the low voltage negative current source having a supply voltage less than 2.0 Volts and controlled by the first reference voltage and operative over the operating range for the loop filter; and selectively charging the loop filter with a low voltage positive current source, the low voltage positive constant current source having a supply voltage less than 2.0 Volts and controlled by the second reference voltage and operative over the operating range for the loop filter.

18. The method of claim 17, wherein the act of selectively discharging comprises discharging the loop filter to a minimum below 0.20 Volts.

19. The method of claim 18, wherein the act of selectively charging comprises charging the loop filter to a maximum potential of at least the supply voltage less 0.2 Volts.

20. The method of claim 19, wherein the supply voltage is less than 2.0 V.

21. The method of claim 20, wherein the most positive supply voltage is substantially 1.8 V and the loop filter is charged to a maximum potential substantially 1.65 V.

22. A PRML read/write channel having a low-voltage charge pump, comprising:

a negative current source being operative to selectively discharge a loop filter with substantially constant negative current that is substantially linearly dependent on a first reference voltage over an operating range for the loop filter; and a positive current source having a most positive supply voltage that is less than 2.0 Volts and operative to selectively charge the loop filter with substantially constant positive current that is substantially linearly dependent on a second reference voltage over the operating range for the loop filter.

23. The PRML read/write channel of claim 22, wherein the negative current source comprises:

a first reference voltage source having a first reference current source, and a first reference resistor device coupled with the first reference current source, the first reference constant current source and the first reference resistor device arranged to generate a first reference voltage at a first reference voltage node;

a first buffer having a first buffer positive input being coupled with the first reference voltage source; and an NMOS transistor having an NMOS source, an NMOS gate, and an NMOS drain, the NMOS drain being coupled with the loop filter, the NMOS gate being coupled with an output for the first buffer and the NMOS source being coupled with a first negative input of the first buffer and coupled with a least positive supply voltage through a pull-down resistor device.

24. The PRML read/write channel of claim 23, wherein the first reference current source is coupled in series between the least positive supply voltage and the first reference voltage node, and the first reference resistor device is coupled in series with the first reference voltage node and the most positive supply voltage.

25. The PRML read/write channel of claim 24, wherein the least positive supply voltage is substantially zero Volts, the most positive supply voltage is approximately 1.80 Volts and the first reference voltage is between 0.050 Volts and 0.20 Volts, and the first buffer is an operational amplifier having a gain of substantially between 60 dB and 80 dB.

26. The PRML read/write channel of claim 24, wherein the positive current source comprises:

a second reference voltage source having a second reference current source and a second reference resistive device coupled with the second reference current source, the second reference current source and the second reference resistive device arranged to provide a second reference voltage at a second reference voltage node;

a second buffer having a second buffer positive input being coupled with the second reference voltage source; and a PMOS transistor having a PMOS source, a PMOS gate, and a PMOS drain, the PMOS drain being coupled with the loop filter, the PMOS gate being coupled with a second buffer output and the PMOS source being coupled with a second buffer negative input and coupled with the most positive supply voltage through a pull-up device.

27. The PRML read/write channel of claim 26, wherein the second reference current source is coupled in series between the most positive supply voltage and the second reference voltage node, and the second reference resistor device is coupled in series between the second reference voltage node and the least positive supply voltage.

28. The PRML read/write channel of claim 27, theoleast positive supply voltage is substantially zero Volts, the most positive supply voltage is substantially 1.80 Volts and the first reference voltage and the second reference voltage are between 0.050 Volts and 0.20 Volts, and the second buffer is an operational amplifier having a gain substantially between 60 dB and 80 dB.

* * * * *

UNITED STATES PATENT AND TRADEMARK OFFICE
CERTIFICATE OF CORRECTION

PATENT NO.     : 6,512,404 B2
DATED          : January 28, 2003
INVENTOR(S)    : Michael A. Ruegg et al.

It is certified that error appears in the above-identified patent and that said Letters Patent is hereby corrected as shown below:

Title page,
Item [56], OTHER PUBLICATIONS, "Technologies-PRML", delete "internet" and substitute -- Internet -- in its place.
"MR and PRML: Technologies in Synergy", delete "Pape        rs/MR__" and substitute -- Papers/MR__ -- in its place.
"A Tutorial on ...", delete "netcom.con/<chip.f/viterbi" and substitute -- netcom.com/~chip.f/viterbi -- in its place.

Column 12,
Line 56, delete "theoleast" and substitute -- the least -- in its place.

Signed and Sealed this

Twenty-ninth Day of July, 2003

JAMES E. ROGAN
*Director of the United States Patent and Trademark Office*